US012123985B2

(12) United States Patent
Ghosh et al.

(10) Patent No.: US 12,123,985 B2
(45) Date of Patent: Oct. 22, 2024

(54) THREE-DIMENSIONAL IMAGING AND SENSING APPLICATIONS USING POLARIZATION SPECIFIC VCSELS

(71) Applicant: AMS SENSORS ASIA PTE. LTD, Singapore (SG)

(72) Inventors: Chuni Ghosh, Eindhoven (NL); Jean-Francois Seurin, Eindhoven (NL)

(73) Assignee: AMS SENSORS ASIA PTE. LTD, Singapore (SG)

(*) Notice: Subject to any disclaimer, the term of this patent is extended or adjusted under 35 U.S.C. 154(b) by 857 days.

(21) Appl. No.: 17/053,731

(22) PCT Filed: May 8, 2019

(86) PCT No.: PCT/SG2019/050259
§ 371 (c)(1),
(2) Date: Nov. 6, 2020

(87) PCT Pub. No.: WO2019/216828
PCT Pub. Date: Nov. 14, 2019

(65) Prior Publication Data
US 2021/0247504 A1    Aug. 12, 2021

Related U.S. Application Data

(60) Provisional application No. 62/668,907, filed on May 9, 2018.

(51) Int. Cl.
*G01S 7/499* (2006.01)
*G01S 7/481* (2006.01)
(Continued)

(52) U.S. Cl.
CPC ............ *G01S 7/499* (2013.01); *G01S 7/4815* (2013.01); *G01S 17/42* (2013.01); *G01S 17/894* (2020.01);
(Continued)

(58) Field of Classification Search
CPC .... G01S 7/499; G01S 17/894; G01S 17/4815; G01S 17/42; G01S 7/4815; G01S 17/89;
(Continued)

(56) References Cited

U.S. PATENT DOCUMENTS 8,136,733 B1 *   3/2012   Yu ...................... G06K 7/10564
                                                    235/462.01
9,693,839 B2 *   7/2017   Atiya ................... A61C 9/0066
(Continued)

FOREIGN PATENT DOCUMENTS

CA       3022442 C  *  8/2019   ........... G01B 11/002
CN       1650151 A      8/2005
(Continued)

OTHER PUBLICATIONS

PCT/SG2019/050259 International Search Report and Written Opinion, mailed Aug. 7, 2019.
(Continued)

*Primary Examiner* — Michael P Stafira
(74) *Attorney, Agent, or Firm* — VIERING, JENTSCHURA & PARTNER MBB

(57) ABSTRACT

Polarized light is produced using a VCSEL light source, wherein at least some of the polarized light is reflected or scattered by an object. At least some of the reflected or scattered polarized light is received in a sensor that is operable selectively to detect received light having a same polarization as the light produced by the VCSEL light source. In some instances, signals from the sensor are processed to obtain a three-dimensional distance image of the object or are processed using a time-of-flight technique to determine a distance to the object.

18 Claims, 6 Drawing Sheets

(51) Int. Cl.
   *G01S 17/42*     (2006.01)
   *G01S 17/894*    (2020.01)
   *H01S 5/183*     (2006.01)
   *H01S 5/42*      (2006.01)
   *H01S 5/34*      (2006.01)

(52) U.S. Cl.
   CPC ...... *H01S 5/18305* (2013.01); *H01S 5/18311* (2013.01); *H01S 5/1835* (2013.01); *H01S 5/18361* (2013.01); *H01S 5/423* (2013.01); *H01S 5/34* (2013.01)

(58) Field of Classification Search
   CPC ...... G01S 7/4816; G01S 7/4817; G01S 17/10; G01S 17/931; G01S 7/484; G01S 7/4865; G01S 7/4863; G01S 7/4814; G01S 7/4811; G01S 17/08; G01S 7/4808; G01S 7/4813; G01S 17/86; G01S 17/48; G01S 7/4818; G01S 17/36; G01S 17/46; G01S 7/486; G01S 7/481; G01S 7/4868; G01S 7/4914; G01S 17/88; G01S 7/497; G01S 17/04; G01S 7/4802; G01S 7/4804; G01S 17/06; G01S 5/16; G01S 7/4876; G01S 17/50; G01S 17/87; G01S 7/487; G01S 1/7038; G01S 17/003; G01S 17/93; G01S 7/483; G01S 7/4972; G01S 11/12; G01S 13/865; G01S 17/32; G01S 17/34; G01S 17/66; G01S 2013/93273; G01S 3/787; G01S 7/4911; G01S 7/493; G01S 13/86; G01S 13/862; G01S 13/867; G01S 13/931; G01S 15/86; G01S 15/931; G01S 2013/93271; G01S 2013/93272; G01S 3/782; G01S 7/48; G01S 7/4913; G01S 7/4915; G01S 7/495

See application file for complete search history.

(56) References Cited

U.S. PATENT DOCUMENTS

| | | | |
|---|---|---|---|
| 10,123,706 B2 * | 11/2018 | Elbaz | G06T 17/00 |
| 10,324,170 B1 * | 6/2019 | Engberg, Jr. | G01S 7/4818 |
| 2002/0148944 A1 | 10/2002 | Tatum et al. | |
| 2005/0179895 A1 | 8/2005 | Puppels | |
| 2007/0181810 A1 | 8/2007 | Tan et al. | |
| 2009/0080907 A1 | 3/2009 | Hagiya et al. | |
| 2010/0157307 A1 | 6/2010 | Taillade et al. | |
| 2011/0306156 A1 | 12/2011 | Johnson et al. | |
| 2012/0134693 A1 | 5/2012 | Hoshi et al. | |
| 2012/0258431 A1 * | 10/2012 | Lauren | A61B 5/4542 |
| | | | 600/595 |
| 2013/0194573 A1 | 8/2013 | Ohba et al. | |
| 2013/0194787 A1 * | 8/2013 | Geske | H01S 5/4087 |
| | | | 362/231 |
| 2013/0216247 A1 | 8/2013 | Oba et al. | |
| 2013/0235377 A1 | 9/2013 | Ishii et al. | |
| 2015/0311673 A1 | 10/2015 | Wang et al. | |
| 2015/0362585 A1 | 12/2015 | Gosh et al. | |
| 2016/0164258 A1 | 6/2016 | Weichmann et al. | |
| 2017/0115497 A1 * | 4/2017 | Chen | G02B 27/12 |
| 2017/0176184 A1 | 6/2017 | Lee et al. | |
| 2017/0188012 A1 * | 6/2017 | Takagi | H04N 5/33 |
| 2020/0068102 A1 * | 2/2020 | Tilleman | H04N 23/56 |

FOREIGN PATENT DOCUMENTS

| | | | | |
|---|---|---|---|---|
| CN | 101385207 A | | 3/2009 | |
| CN | 101393372 A | | 3/2009 | |
| CN | 101813776 A | | 8/2010 | |
| CN | 102478773 A | | 5/2012 | |
| CN | 102878950 A | * | 1/2013 | ......... G01B 11/2509 |
| CN | 103221803 A | | 7/2013 | |
| CN | 103257543 A | | 8/2013 | |
| CN | 103309194 A | | 9/2013 | |
| CN | 105474482 A | | 4/2016 | |
| CN | 205809294 U | | 12/2016 | |
| CN | 106896365 A | | 6/2017 | |
| EP | 2157401 A1 | * | 2/2010 | .......... G01B 11/002 |
| EP | 2827175 A2 | | 1/2015 | |
| GB | 2585069 A | * | 12/2020 | ............... H01S 5/18 |
| JP | 2017187431 A | * | 10/2017 | |
| WO | WO-2012007003 A1 | * | 1/2012 | ......... A61C 13/0004 |
| WO | WO-2015014797 A1 | * | 2/2015 | ............. G01B 11/25 |
| WO | 20170151846 A1 | | 9/2017 | |

OTHER PUBLICATIONS

Chinese search report issued for the corresponding Chinese patent application No. 2019800457060, dated Aug. 9, 2023, 4 pages (for informational purposes only).

Supplementary search report issued for the parallel Chinese patent application No. 201980045706, dated Apr. 26, 2024, 2 pages (for informational purposes only).

* cited by examiner

THREE-DIMENSIONAL IMAGING AND SENSING APPLICATIONS USING POLARIZATION SPECIFIC VCSELS

CROSS-REFERENCE TO RELATED APPLICATIONS

This application is a 371 U.S. National Phase of PCT International Patent Application No. PCT/SG2019/050259, filed on May 8, 2019, which claims benefit and priority to U.S. provisional patent application No. 62/668,907, filed on May 9, 2018, the disclosures of which are each incorporated by reference herein in their entirety.

FIELD OF THE DISCLOSURE

The present disclosure relates to three-dimensional (3D) imaging and sensing applications using polarization specific vertical cavity surface emitting lasers (VCSELs).

BACKGROUND

A VCSEL can provide a small, compact, powerful laser source for various illumination applications. The use of VCSELs as an illumination source for structured light imaging systems, light detection and ranging (LIDAR) systems, and other types of 3D sensing and imaging systems, is being applied in a rapidly growing field of applications. Typical systems for various applications include an un-polarized or randomly polarized VCSEL source. The sensitivity of these systems, however, can be limited by optical noise from the environment and scattering of the VCSEL beam by aerosols and other background scattering media.

SUMMARY

This disclosure describes 3D light imaging and sensing systems that use one or more polarized VCSELs. By using an optical sensor that is operable selectively to detect light having the same polarization as the illumination emitted by the VCSEL(s), VCSEL light reflected or scattered from an object, and having the same polarization as that emitted by the VCSEL(s), is detected. Optical noise having orthogonal polarization, and orthogonal polarization components of VCSEL light scattered from aerosols and similar media, is not detected. In some implementations, the systems have increased sensitivity. An important benefit for some applications can be a reduction in power consumption.

As an example, in one aspect, the present disclosure describes a module for light imaging and/or light that includes a VCSEL light source operable to produce polarized light, and a sensor operable selectively to detect received light having a same polarization as the light produced by the VCSEL light source, wherein the received light is reflected or scattered by an object external to the module.

In another aspect, the present disclosure describes a method that includes producing polarized light using a VCSEL light source, wherein at least some of the polarized light is reflected or scattered by an object. The method also includes receiving at least some of the reflected or scattered polarized light in a sensor that is operable selectively to detect received light having a same polarization as the light produced by the VCSEL light source. In some instances, the method further includes processing signals from the sensor to obtain a three-dimensional distance image of the object or processing signals from the sensor using a time-of-flight technique to determine a distance to the object.

Some implementations include one or more of the following features. For example, in some cases, the VCSEL light source is operable to produce linear polarized light. Various VCSEL structures can be used to produce linear polarized light. Thus, in some instances, the VCSEL light source includes a VCSEL having an asymmetric aperture. In some cases, the VCSEL light source includes a VCSEL that includes one or more reflective gratings. In some cases, the VCSEL includes a sub-wavelength reflective grating.

In some implementations, the VCSEL light source includes a VCSEL in which first and second diffractive Bragg reflectors are separated from one another and define a laser resonant cavity, wherein the VCSEL light source further includes a reflective grating adjacent at least one of the first or second diffractive Bragg reflectors. In some cases, the first diffractive Bragg reflector is partially reflecting, and the reflective grating is adjacent the first diffractive Bragg reflector. In some implementations, the VCSEL structure includes a first reflective grating adjacent the first diffractive Bragg reflector, and a second reflective grating adjacent the second diffractive Bragg reflector. In some instances, the VCSEL light source includes a VCSEL that has first and second reflective gratings separated from one another and defining a laser resonant cavity.

Other aspects, features and advantages will be readily apparent from the following detailed description, the accompanying drawings, and the claims.

BRIEF DESCRIPTION OF THE DRAWINGS

FIG. 2A is a top view, and FIG. 2B is a cross-sectional side view.

DETAILED DESCRIPTION

Figure 1:
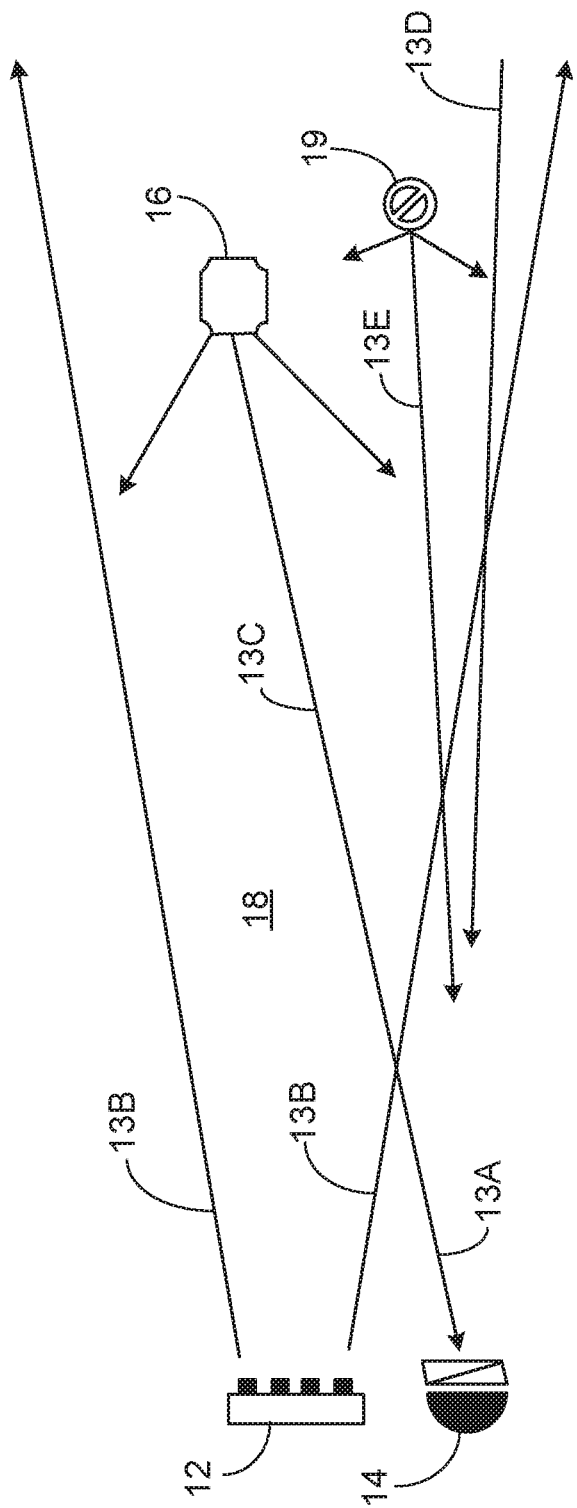
FIG. 1 illustrates an example of a light imaging or sensing system that uses a linearly polarized VCSEL light source.
Figure 2A:
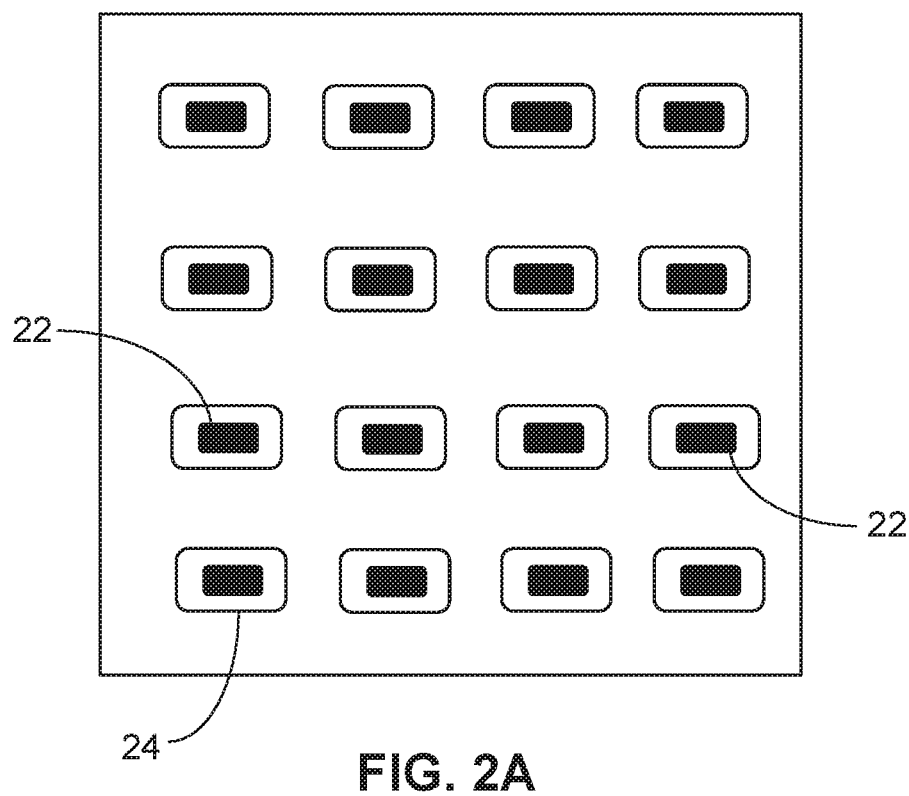
FIGS. 2A and 2B (collectively, FIG. 2) illustrate an example of a VCSEL structure operable to produce linear polarized light.
Figure 2B:
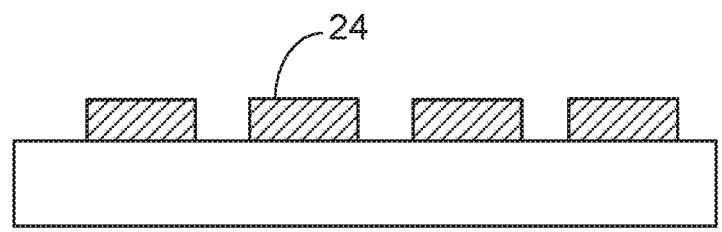

As shown in FIG. 1, a 3D structured light imaging or ranging system 10 includes a polarized VCSEL light source 12, and an optical sensor 14 having a polarization filter aligned to the polarization of the VCSEL source. Thus, the optical sensor 14 is operable to detect selectively light 13A having the same polarization as the light 13B produced by the VCSEL light source 12. The VCSEL light source 12 can include a single VCSEL (e.g., in the case of a LIDAR system) or multiple VCSELS such as an array of VCSELs (e.g., in the case of a structured light imaging system). Use of VCSELs can be advantageous because a VCSEL provides a small, compact, powerful laser source. In some instances, the VCSEL light source 12 and the sensor 14 are housed, for example, in a module. One or more linear polarized beams 13B from the VCSEL light source 12 are directed to a region of interest 18 (e.g., outside the module). The light beams 13B produced by the VCSEL light source 12 can include, for example, infra-red (IR), near-IR, or light of other wavelengths, depending on the needs of the particular application. In some instances, passive optical elements such as lenses are provided to adjust the divergence and direction of the beam(s). An object 16 outside the module in the path of the VCSEL beam(s) 13B can reflect and scatter radiation 13C from the beam(s) in various directions depending, for example, on the shape and composition of the object. VCSEL light incident 13B on a surface of the object at a normal angle may be reflected back toward the sensor 14, which can be positioned near the light source 12. The light 13C reflected back toward the sensor 14 primarily will be polarized in the same linear polarization as the incident beam 13B emitted from the light source 12.

Structured light imaging systems use structured illumination, which refers to a spatially coded or modulated illumination. The structured illumination may have any regular shape, e.g. lines or circles, or may have a pseudo-random pattern such as pseudo-random dot patterns or further may have pseudo-random shapes or sizes of shapes. In a structured imaging system, the image sensor 14 can be implemented, for example, as an array of pixels. A signal processor can be provided to process the raw image(s) acquired by the sensor 14 and derive a three-dimensional depth map of the acquired objects 16.

In a structured light system suitable, for example, for smartphone applications, the light source 12 can be implemented as an array of VCSELs whose beams are projected into the region of interest 18. The sensor 14 can be implemented, for example, as a camera to record the spot image based on reflections from one or more objects 16. Lateral spot locations in the recorded image will depend on the distance of the object(s) 16 from the sensor 14 and VCSEL light source 12. The spot image(s) then can be analyzed, for example, by a computing device (e.g., signal processor) in the smartphone to compute the 3D locations of the objects 16.

Optical ranging systems, such as time-of-flight (TOF) systems, can collect distance data for one or more objects 16. Distance data can include, for example, the distance between the one or more objects and the optical ranging system. In contrast to a structured light imaging system, in a optical ranging system such as a LIDAR system, the sensor 14 can be implemented, for example, as a single photodetector to receive and record signals indicative of the time-of-flight of a pulsed beam from a single VCSEL to an object 16 and back to the sensor 14. In some instances, the sensor 14 includes one or more demodulation light sensitive elements (i.e., pixels). The time-of-flight can be calculated, for example by a computing device (e.g., signal processor), and used to determine the distance to the object 16. For example, the signal processor can use signals from the pixel(s) to calculate the time the light has taken to travel from the VCSEL light source 12 to an object 16 of interest and back to the focal plane of the sensor 14. The TOF sensor, together with the associated electronics and logic, is thus operable to resolve distance based on the known speed of light by measuring the time-of-flight of a light signal between the sensor 14 and a point of the object 16. If the VCSEL beam is scanned across the object 16, then a complete 3D location record of the object 16 can be obtained.

Using a linearly polarized VCSEL light source 12 can, in some instances, increase the sensitivity of the system 10. By using a sensor 14 that is restricted to detecting light having the same linear polarization as the light emitted by the VCSEL light source, VCSEL light reflected or scattered from objects 16 with the same polarization is detected. On the other hand, optical noise having orthogonal polarization, and orthogonal polarization components of VCSEL light scattered from aerosols and similar media, would not be detected by the sensor 14. Using linearly polarized VCSELs in conjunction with polarization sensors can, in some cases, provide enhanced sensitivity and resolution in various applications. For example, a potential benefit for smartphone and other applications is a reduction in power consumption. For other, less power-sensitive applications, the disclosed techniques can result in greater distance range.

FIGS. 2 through 6 illustrate examples of linearly polarized VCSEL structures. For example, FIGS. 2A and 2B illustrate an example of a non-circular VCSEL device structure 20 operable to produce linearly polarized light using an asymmetric aperture 22. An elliptical or other asymmetric cross section mesa 24 is etched to provide the VCSEL element. Then, during a subsequent oxidation process to provide the current aperture, the asymmetry is formed in the aperture shape. For example, in some instances, the VCSEL array mesas 24 are fabricated with an oval cross-section. When the VCSEL current-confining oxide apertures are formed, they have a similar, but smaller, oval shape as well. This feature results in an oval cross-section gain section so that the VCSEL devices 20 operate with oval-shaped beams. The oval structure results in asymmetric thermal and electrical stress applied to the VCSEL crystal structure, which results in a refractive index asymmetry. This optical asymmetry causes the VCSEL to lase in a linear polarization aligned to the refractive index asymmetry.

In general, there should be sufficient asymmetry to overcome any other polarization biases in the VCSEL structure. Further, as mentioned above, the VCSEL array layout of FIG. 2 incorporates asymmetric apertures 22 and produces controlled linear polarization in oval-shaped output beams. The non-circular VCSEL beams produced by the VCSEL structure 20 may have associated variations in beam divergence properties. Thus, the VCSEL structure 20 may be more useful for applications where such issues are not a concern.

In other implementations, VCSEL structures operable to produce linear polarized light include one or more reflection gratings. These structures can, in some cases, produce a substantially symmetrical, round output light beam (i.e., a beam having a round, or substantially round, cross-section). The VCSELs can be top-emitting or bottom-emitting. In some implementations, the reflection grating is functionally combined with a distributed Bragg reflector (DBR). In other cases, the reflection grating advantageously can be used even in the absence of an associated DBR.

Figure 3:
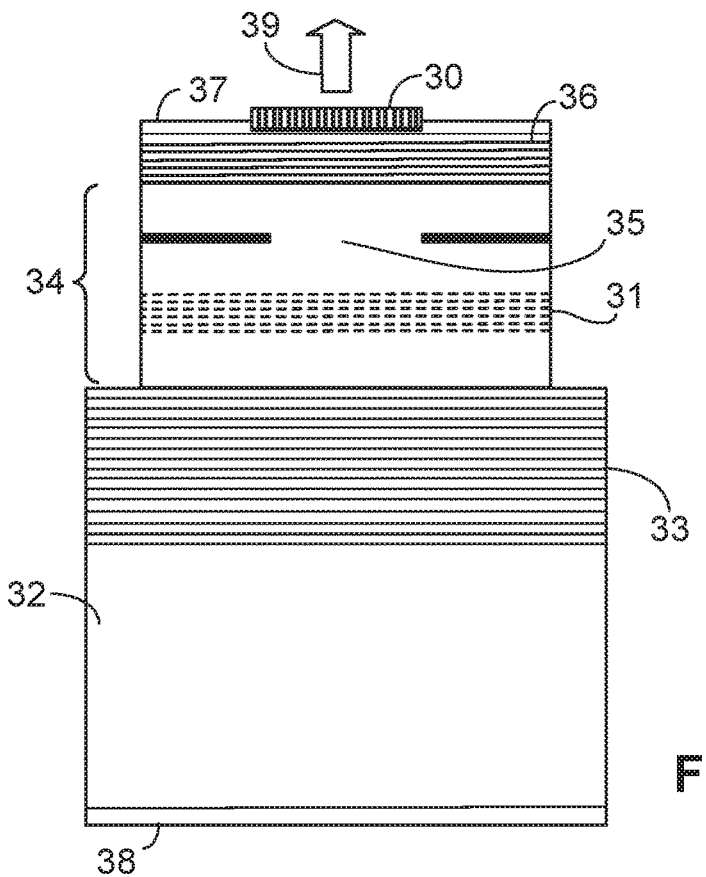
FIG. 3 illustrates a VCSEL another structure operable to produce linear polarized light.

As shown in the example of FIG. 3, a top-emitting VCSEL structure includes a sub-wavelength reflection grating 30 combined with a top, partially reflecting DBR 36. In the illustrated example, the VCSEL structure is fabricated on the top of a substrate 32, and the output beam 39 is transmitted out of the top of the structure. The VCSEL structure includes a bottom, high reflecting DBR 33 as well as the top, partially reflecting DBR 36 which transmits the output beam 39. The two DBRs 33, 36, which can be implemented as mirrors, form a laser resonant cavity. Between the two DBRs 33, 36 is the gain region 34, including a group or stack of multiple quantum wells 31, which can be activated, for example, by a current flowing between top and bottom electrical contacts (e.g., electrodes)

37, 38. In some designs, the quantum wells 31 are activated by shining a laser beam on them to pump the carriers optically. In VCSELs activated by current, an aperture 35 can be used to concentrate the current in the center region. This aperture 35 can be formed, for example, by oxidation, although other techniques such as ion implantation can be used to form the electrically insulating region around the aperture.

As illustrated in FIG. 3, the reflection grating 30 is formed on top of the upper DBR 36, whose reflectivity can be adjusted to optimize the total combined reflectivity. The combined structure of the reflection grating 30 and DBR 36 should be designed and fabricated to have the proper phase relationship.

Figure 4:
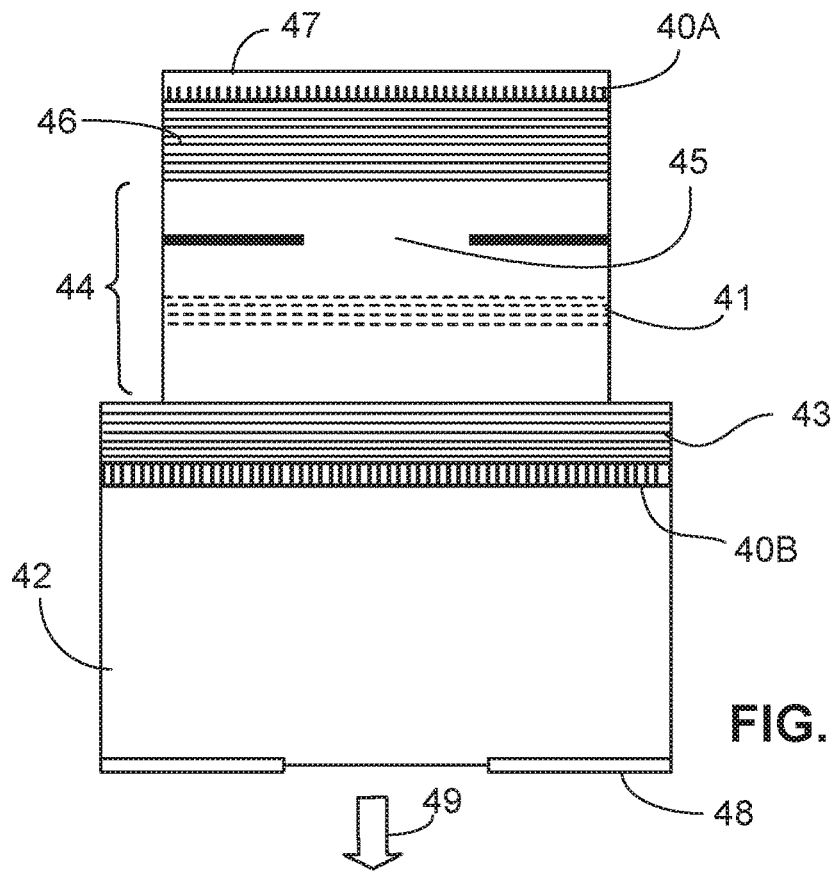
FIG. 4 illustrates another example of a VCSEL structure operable to produce linear polarized light.

FIG. 4 illustrates another VCSEL structure operable to produce linear polarized light that has a round, or substantially round, beam cross-section. The illustrated example is a bottom-emitting VCSEL structure in which respective reflection gratings 40A, 40B operate in conjunction, respectively, with the upper DBR 46 and the lower DBR 43. In this case, the bottom DBR 43 is partially reflective, whereas the top mirror 46 is highly reflective so that the output beam 49 is transmitted through the substrate 42. The two DBRs 43, 46, which can be implemented as mirrors, form a laser resonant cavity. Between the two DBRs 43, 46 is the gain region 44, including a group or stack of multiple quantum wells 41, which can be activated, for example, by a current flowing between top and bottom electrical contacts (e.g., electrodes) 47, 48. A respective one of the reflection gratings 40A, 40B is disposed adjacent each of the DBRs 43, 46. An aperture 45 can be used to concentrate the current in the center region. The VCSEL structure of FIG. 4 can be bonded, for example, in direct contact with a heat sink for more efficient cooling.

Figure 5:
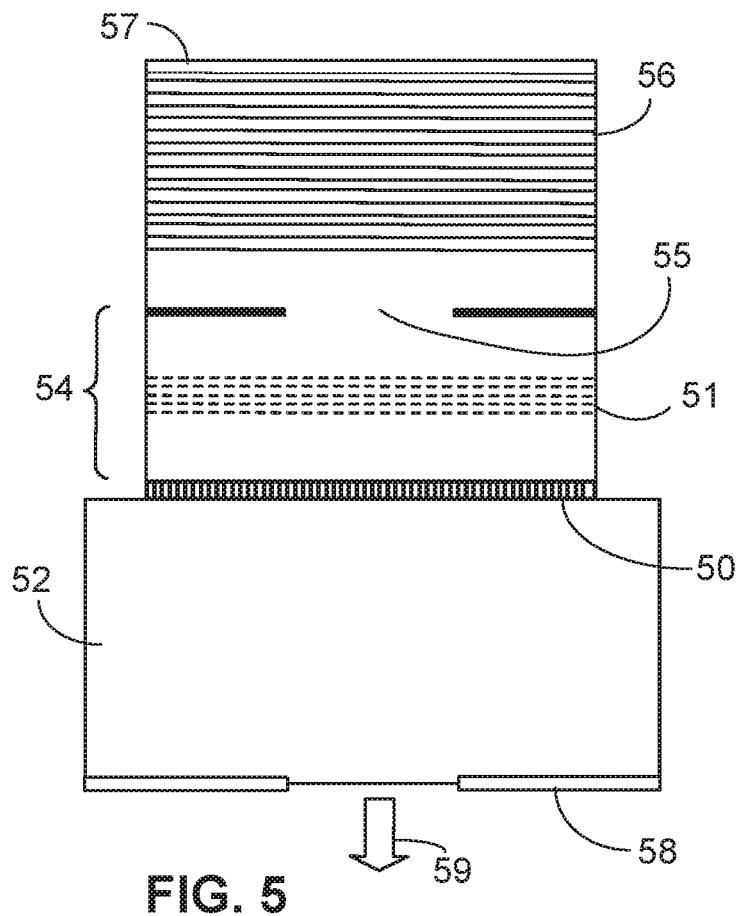
FIG. 5 illustrates a further VCSEL structure operable to produce linear polarized light.

In some implementations, such as where the sub-wavelength reflection grating has a very high reflectivity (e.g., close to 100%), the reflection grating can obviate the need for the associated DBR. An example is illustrated in FIG. 5, which shows a bottom-emitting VCSEL structure operable to produce linear polarized light that has a round, or substantially round, beam cross-section. In this case, the VCSEL structure includes a highly reflective sub-wavelength reflection grating 50, but no bottom DBR. The top DBR 56, which can be implemented as a mirror, is highly reflective so that the output beam 59 is transmitted through the substrate 52. The laser resonant cavity is formed between the top DBR 56 and the reflection grating 50 and includes the gain region 54. The gain region 54 includes a group or stack of multiple quantum wells 51, which can be activated, for example, by a current flowing between top and bottom electrical contacts (e.g., electrodes) 57, 58. An aperture 55 can be used to concentrate the current in the center region.

Details of the reflective grating may vary depending on the particular application. As an example of a known structure, the sub-wavelength reflective grating can include a one dimensional grating structure with lines made of high refractive index material disposed between low refractive index materials. The index difference between the high and low index materials determines the bandwidth and modulation depth and gives rise to wider reflection bands. The reflection is sensitive to various parameters such as the grating period, the grating thickness, the duty cycle of the grating, the refractive index and the thickness of the low index layer underneath the grating. In some instances, the sub-wavelength reflective grating can include a first layer of low refractive index material, multiple periodically spaced-apart segments of high refractive index material on the layer of low refractive index material, and a second layer of low refractive index material on the segments of high refractive index material. Other reflective grating structures can be used as well.

Figure 6:
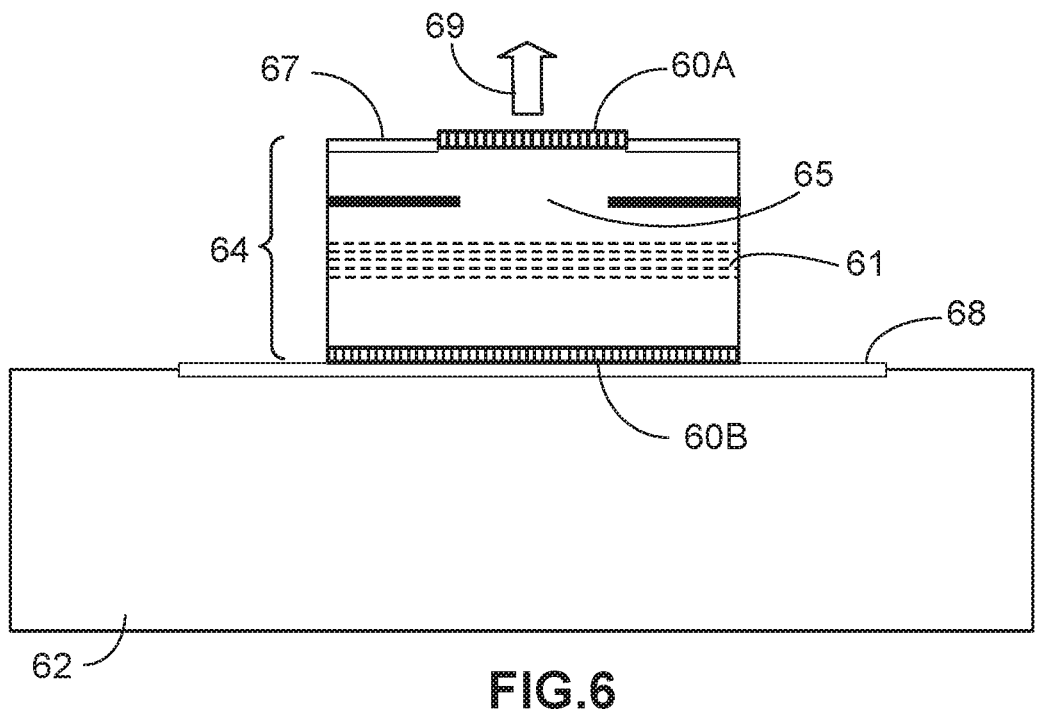
FIG. 6 illustrates yet another VCSEL structure operable to produce linear polarized light.

In some implementations, each of the top and bottom DBRs can be omitted from the VCSEL structure and can be replaced by a respective reflective grating. FIG. 6 illustrates an example which shows a top-emitting VCSEL structure operable to produce linear polarized light that has a round, or substantially round, beam cross-section. The output beam 69 is transmitted out of the top of the structure, which is formed over a substrate 62. In this case, the VCSEL structure includes highly reflective sub-wavelength reflection gratings 60A, 60B, but no bottom or top DBRs. The laser resonant cavity is formed between the top and bottom reflection gratings 60A, 60B and includes the gain region 64. The gain region 64 includes a group or stack of multiple quantum wells 61, which can be activated, for example, by a current flowing between top and bottom electrical contacts (e.g., electrodes) 67, 68. An aperture 65 can be used to concentrate the current in the center region.

Replacing one, or both, DBRs with respective reflective grating can provide other advantages as well in some instances. For example, the smaller length along the optic axis of the VCSEL structure can result in a thinner VCSEL device. In addition, depending on the materials used, the electrical resistance can be reduced. The lower resistance can help reduce the electrical power dissipation, which in turn can result in higher electrical-to-optical power conversion efficiency. Further, the optical absorption loss can be less because using reflective grating(s) does not require different material doping levels as would be required for the DBR structure(s). These features can result in higher efficiency for the VCSEL, leading to the benefit of lower input power for the same optical output power.

As noted above, the use of a linearly polarized VCSEL light source 12 combined with a linear polarized sensor 14 can increase the sensitivity by increasing the signal-to-noise ratio. Ambient light 13D (see FIG. 1) which may generate a noise signal in the sensor is unpolarized; thus, about fifty percent of this optical noise would be eliminated by the sensor polarization analyzer. Aerosols 19 (see FIG. 1) in the atmosphere also tend to scatter light 13E back into the sensor 14. Typically there are multiple internal reflections inside the aerosol 19, which tends to depolarize the incident linear polarized beam. Thus, noise signals from this kind of scattering object also can be attenuated.

The processing circuitry can be implemented, for example, as one or more integrated circuits in one or more semiconductor chips with appropriate digital logic and/or other hardware components (e.g., read-out registers; amplifiers; analog-to-digital converters; clock drivers; timing logic; signal processing circuitry; and/or microprocessor). The processing circuitry is, thus, configured to implement the various functions associated with such circuitry.

The modules described here can be useful, for example, as proximity sensor modules or as other optical sensing modules, such as for gesture sensing or recognition. The modules can be integrated into a wide range of electronic and other devices, such as mobile phones, smart phones, cameras, laptops, personal digital assistants (PDAs), and tablet computers, as well as others. The modules may be integrated into a wide range of small electronic devices, such as bio devices, mobile robots, and surveillance cameras, among others.

Figure 7:
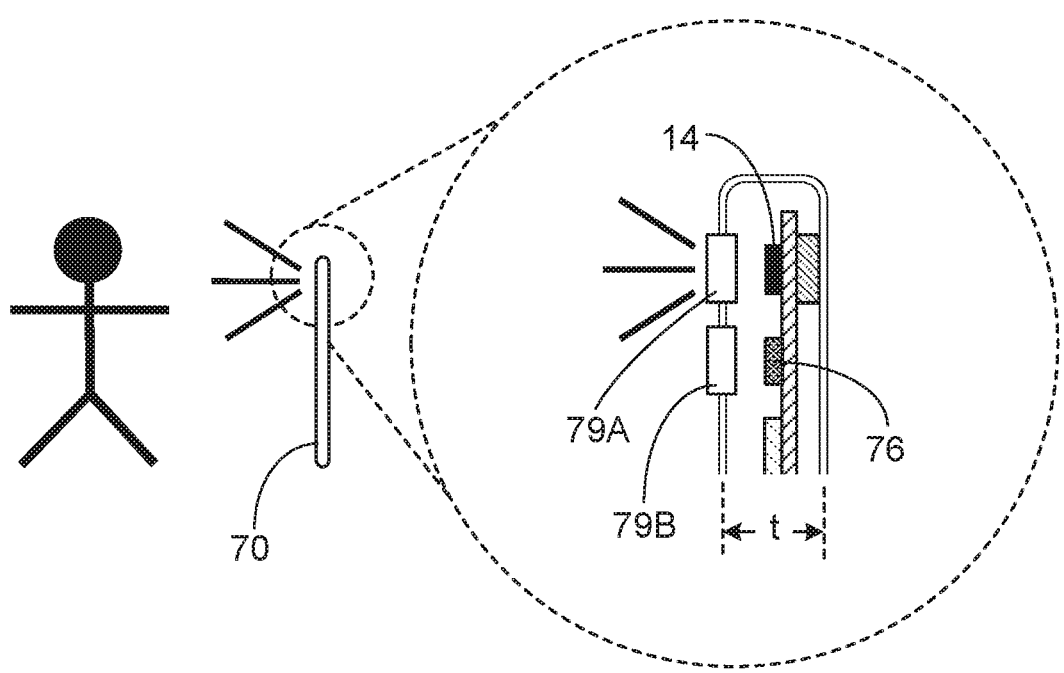
FIG. 7 illustrates an example of a smartphone that includes a module operable to emit and sense polarized light.

FIG. 7 illustrates an example of a smartphone 70 that includes a module 72 for 3D imaging and/or sensing. The module 72 is operable to emit polarized light and to detect, selectively, incoming beams having the same polarization as the emitted beams. The module 72 includes a polarized VCSEL light source 74 that includes one or more VCSELs operable to emit polarized light. In some instances, the light produced by the light source 74 is structured. The module 72 further includes a polarization sensitive sensor 76 operable to sense, selectively, incoming beams having the same polarization as the beams emitted by the light source 74. The VCSEL light source 74 and the sensor 76 can be mounted, for example, on a printed circuit board or other substrate 78. The module 72 also can include projection optics 79A and collection optics 79B, which can be implemented, for example, as lenses or other passive optical elements. Signal processing circuitry 77 is operable to process signals detected by the sensor 76 and to determine, for example, the distance to an object outside the smartphone 70 that reflects some of the polarized light back toward the smartphone, and/or for gesture recognition.

In some implementations, the smartphone 70 has a thickness (t) on the order of several millimeters (e.g., 5-7 mm). By using a linear polarized VCSEL source, the required imaging sensitivity can be obtained with higher signal-to-noise ratio, which can result in lower total power being required for operation.

Figure 8:
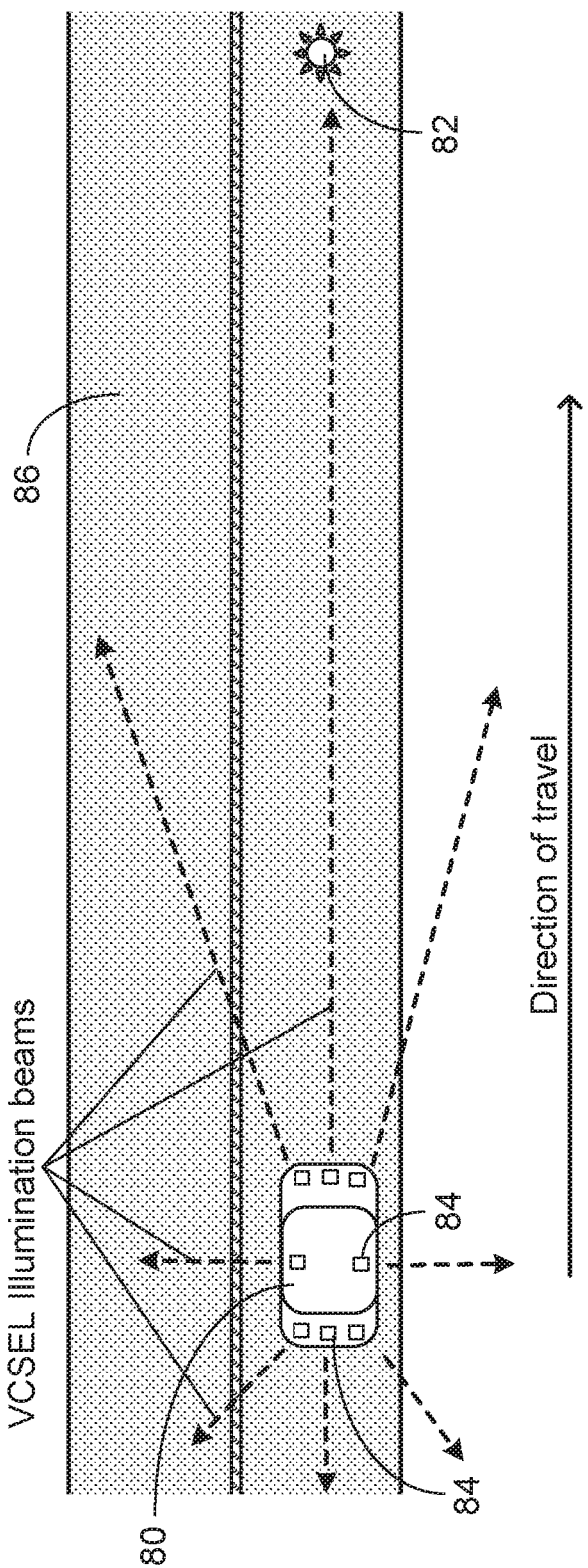
FIG. 8 illustrates an example of a vehicle collision avoidance and monitoring system including modules operable to emit and sense polarized light.

FIG. 8 illustrates another example application in the context of automobile safety. Collision avoidance sensors and monitoring systems can use multiple LIDAR modules to detect objects 82 including other vehicles on the road 86, to analyze potential hazardous situations and to provide an audible or other warning to the driver of the vehicle. The LIDAR modules 84, each of which includes a polarized VCSEL light source and corresponding polarization sensitive sensor as described above, can be located at different locations on or in the vehicle 80 to detect objects 82 outside the vehicle 80 and to determine their distance from the vehicle. In general, it is desirable for these systems to be small, compact and relatively inexpensive, but still provide good sensitivity in sensing hazardous objects.

In addition to smartphones and other portable computing devices, as well as automobile collision avoidance and monitoring systems, the techniques, modules and systems described above can be used in other applications, including, but no limited to, computer gaming systems.

Various modifications can be made to the foregoing examples. Accordingly, other implementations are within the scope of the claims.

What is claimed is:

1. A module for light imaging and/or light sensing comprising:
a VCSEL light source operable to produce polarized light, wherein the VCSEL light source includes a VCSEL that includes a sub-wavelength reflective grating; and
a sensor comprising a polarization filter aligned to the polarized light produced by the VCSEL light source, the sensor operable selectively to detect received light having a same polarization as the light produced by the VCSEL light source, the received light being reflected or scattered by an object external to the module.

2. The module of claim 1 wherein the VCSEL light source is operable to produce linear polarized light.

3. The module of claim 1 wherein the VCSEL light source is operable to produce structured light.

4. The module of claim 1 wherein the VCSEL light source includes a VCSEL having an asymmetric aperture and, optionally, wherein the asymmetric aperture is oval shaped.

5. The module of claim 1 wherein the VCSEL light source includes first and second diffractive Bragg reflectors separated from one another and defining a laser resonant cavity, the VCSEL light source further including a reflective grating adjacent at least one of the first or second diffractive Bragg reflectors.

6. The module of claim 5 wherein the first diffractive Bragg reflector is partially reflecting, and the reflective grating is adjacent the first diffractive Bragg reflector; or including a first reflective grating adjacent the first diffractive Bragg reflector, and a second reflective grating adjacent the second diffractive Bragg reflector; or wherein the reflective grating is a sub-wavelength reflective grating.

7. The module of claim 1 wherein the VCSEL light source includes first and second reflective gratings separated from one another and defining a laser resonant cavity and, optionally, wherein at least one of the first or second reflective grating is a sub-wavelength reflective grating.

8. The module of claim 1 wherein the VCSEL light source includes a top emitting VCSEL.

9. The module of claim 1 wherein the VCSEL light source includes a bottom emitting VCSEL.

10. The module of claim 1 wherein the module is operable for three-dimensional structured light imaging or wherein the module is operable for three-dimensional time-of-flight ranging.

11. A method comprising:
producing polarized light using a VCSEL light source that includes a sub-wavelength reflective grating, wherein at least some of the polarized light is reflected or scattered by an object; and
receiving at least some of the reflected or scattered polarized light in a sensor comprising a polarization filter aligned to the polarized light produced by the VCSEL light source, the sensor being operable selectively to detect received light having a same polarization as the light produced by the VCSEL light source.

12. The method of claim 11 including processing signals from the sensor to obtain a three-dimensional distance image of the object or including processing signals from the sensor using a time-of-flight technique to determine a distance to the object.

13. The method of claim 11 wherein the polarized light is linear polarized light and/or wherein the polarized light is structured light.

14. The method of claim 11 including producing the polarized light using a VCSEL having an asymmetric aperture or including producing the polarized light using a VCSEL that includes a reflective grating.

15. The method of claim 11 including producing the polarized light using a VCSEL that includes first and second diffractive Bragg reflectors separated from one another and defining a laser resonant cavity, the VCSEL further including a reflective grating adjacent at least one of the first or second diffractive Bragg reflectors, optionally, wherein the first diffractive Bragg reflector is partially reflecting, and the reflective grating is adjacent the first diffractive Bragg reflector or wherein the VCSEL includes a first reflective grating adjacent the first diffractive Bragg reflector, and a second reflective grating adjacent the second diffractive Bragg reflector.

16. The method of claim 11 including producing the polarized light using a VCSEL that includes first and second reflective gratings separated from one another, the reflective gratings defining a laser resonant cavity.

17. The module of claim 1, wherein the sub-wavelength reflective grating comprises a one dimensional grating structure with layers made of high refractive index material disposed between low refractive index materials.

18. The method of claim 11, wherein the sub-wavelength reflective grating comprises a one dimensional grating structure with layers made of high refractive index material disposed between low refractive index materials.

\* \* \* \* \*